(12) United States Patent
Kim (10) Patent No.: US 8,497,724 B2
(45) Date of Patent: Jul. 30, 2013

(54) CIRCUIT AND METHOD FOR DELAYING SIGNAL

(75) Inventor: Tae-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 6 days.

(21) Appl. No.: 13/332,063

(22) Filed: Dec. 20, 2011

(65) Prior Publication Data

US 2012/0262210 A1 Oct. 18, 2012

(30) Foreign Application Priority Data

Apr. 12, 2011 (KR) ........................ 10-2011-0033707

(51) Int. Cl.
*H03H 11/26* (2006.01)

(52) U.S. Cl.
USPC ........................ 327/261; 327/212; 365/189.05

(58) Field of Classification Search
USPC ................ 327/261, 263, 199, 201, 212–214; 365/189.05, 189.17, 230.08
See application file for complete search history.

(56) References Cited

U.S. PATENT DOCUMENTS

| 5,939,915 | A | * | 8/1999 | Curran | 327/202 |
| 6,304,123 | B1 | * | 10/2001 | Bosshart | 327/212 |
| 6,501,315 | B1 | * | 12/2002 | Nguyen | 327/217 |
| 7,388,417 | B2 | * | 6/2008 | Kim et al. | 327/403 |
| 2003/0005345 | A1 | | 1/2003 | Fletcher et al. | |
| 2011/0291727 | A1 | | 12/2011 | Kim | |

FOREIGN PATENT DOCUMENTS

JP 11-045127 2/1999

OTHER PUBLICATIONS

Notice of Allowance issued by the Korean Intellectual Property Office on Jan. 31, 2013.

* cited by examiner

*Primary Examiner* — An Luu
(74) *Attorney, Agent, or Firm* — IP & T Group LLP (57) ABSTRACT

A delay circuit includes a delay unit configured to delay a reference input signal and generate a reference output signal and a storage unit configured to store a plurality of input signals in response to the reference input signal and output the stored signals in response to the reference output signal.

16 Claims, 8 Drawing Sheets

FIG. 9

CIRCUIT AND METHOD FOR DELAYING SIGNAL

CROSS-REFERENCE TO RELATED APPLICATIONS

The present application claims priority of Korean Patent Application No. 10-2011-0033707, filed on Apr. 12, 2011, which is incorporated herein by reference in its entirety.

BACKGROUND

1. Field

Exemplary embodiments of the present invention relate to a delay circuit used for delaying a signal in various integrated circuits.

2. Description of the Related Art

A delay circuit (or shift circuit) refers to as a circuit which delays and outputs an input signal to control the timing of transmitting a signal. In particular, a variable delay circuit refers to a circuit which delays and outputs an input signal based on a preset or predetermined value. Since various integrated circuits operate in synchronization with their specific operation sequences and operation timings, the variable delay circuit having a variable delay value is widely used in the integrated circuits, e.g., semiconductor devices.

Figure 1:
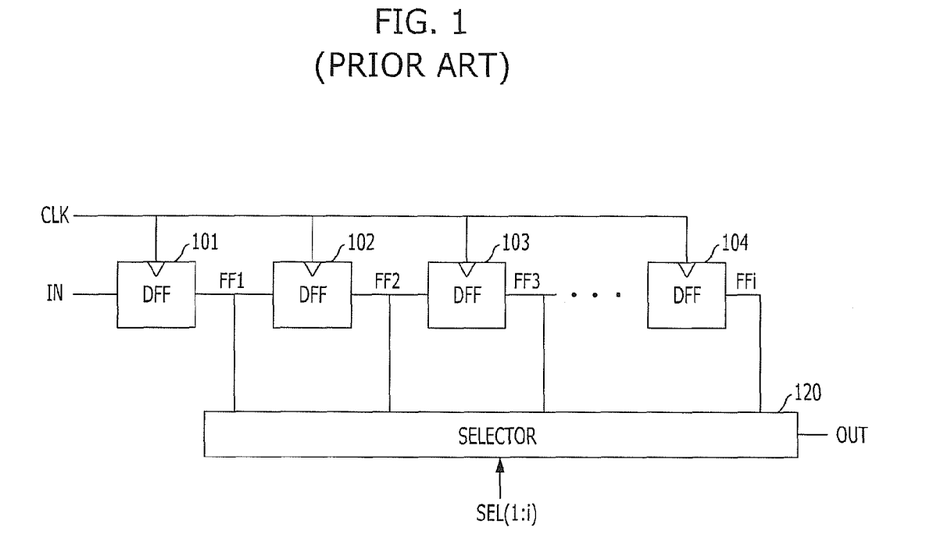
FIG. 1 is a block diagram of showing a configuration of a conventional delay circuit for one input signal.

FIG. 1 is a block diagram of showing a configuration of a conventional delay circuit for single input signal.

Referring to FIG. 1, the delay circuit typically includes a delay unit which has a plurality of shifters 101 to 104 coupled in series and a selector 120 configured to select one of outputs FF1 to FFi of the shifters 101 to 104.

Each of the shifters 101 to 104 is configured to delay a signal inputted thereto by one clock in synchronization with a clock signal CLK, and the selector 120 is configured to select one of output signals FF1 to FFi of the shifters 101 to 104 and output selected signal as a final output signal OUT of the delay circuit. Therefore, the delay value of the delay circuit is determined depending on an output signal selected by the selector 120, wherein the output signal is selected among the output signals FF1 to FFi of the shifters 101 to 104.

Delay information SEL<1:i> inputted to the selector 120 is used in determining the output signal selected by the selector 120, wherein the output signal is selected among the output signals FF1 to FFi of the shifters 101 to 104. That is, the delay information SEL<1:i> is information indicating the delay value of the delay circuit.

Figure 2:
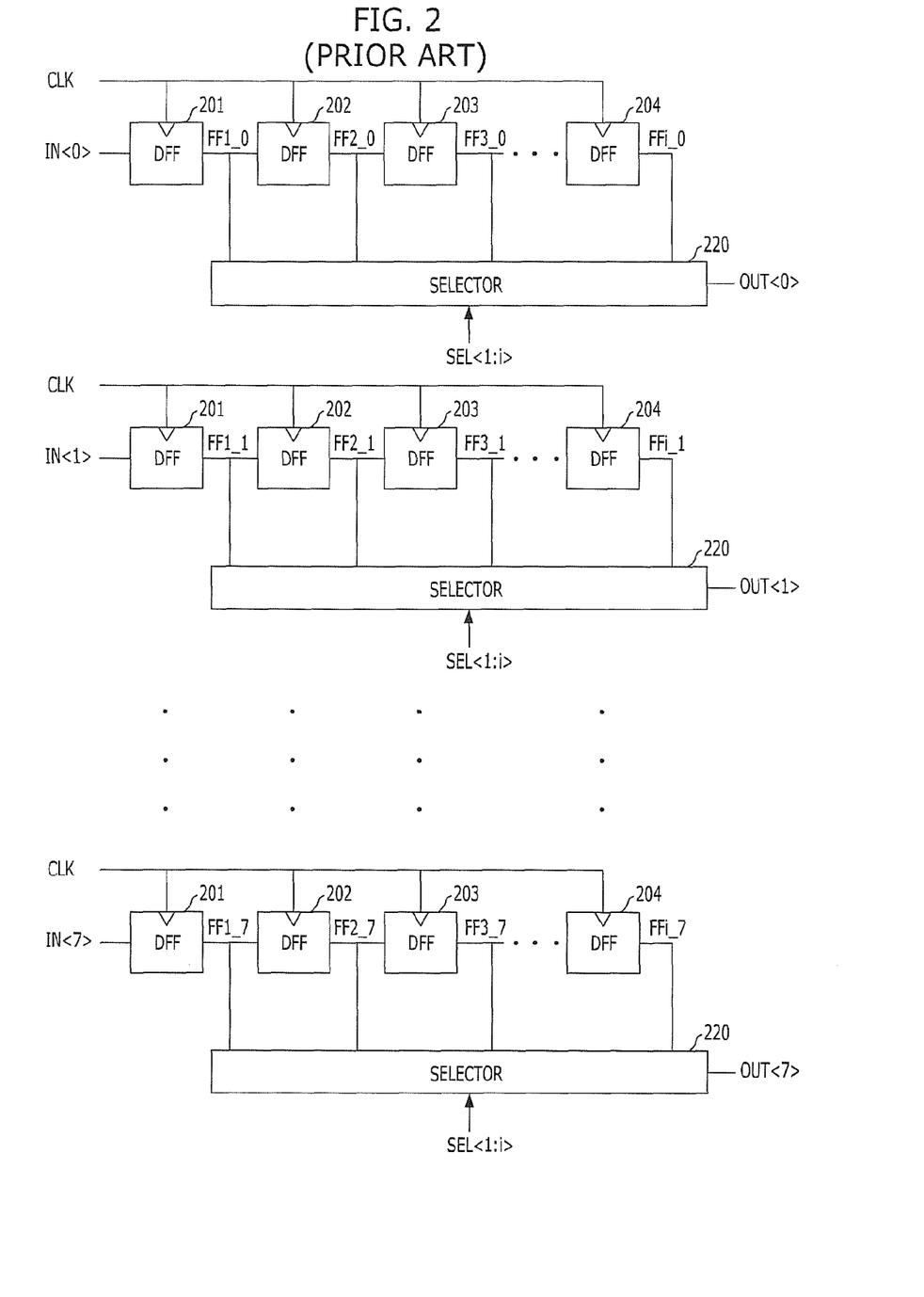
FIG. 2 is a block diagram of a configuration of a conventional delay circuit for delaying a plurality of input signals.

FIG. 2 is a block diagram of showing a configuration of a conventional delay circuit for delaying a plurality of input signals, e.g., eight signals.

Referring to FIG. 2, the delay circuit of FIG. 2 includes eight delay units illustrated in FIG. 1. Since the number of input signals IN<0:7> to be delayed increases from one to eight, the area of the delay circuit also increases eight times. The total number of the shifters is obtained by multiplying the number of input signals and the maximum delay value of each of the input signals. For example, when the number of input signals to be delayed by the delay circuit is 10 and the maximum delay value supported by each of the delay units is 10 clocks, the delay circuit may be provided with 100 (10×10) shifters.

That is, according to the conventional delay circuit, the area of the delay circuit may increase in a geometric progression, as the number of input signals to be delayed by the delay circuit increases and the delay amount increases.

SUMMARY

Exemplary embodiments of the present invention are directed to a delay circuit capable of reducing the entire area and power consumption for delaying a plurality of input signals with a stable operation.

In accordance with an exemplary embodiment of the present invention, a delay circuit includes a plurality of input lines, a delay unit configured to delay a reference input signal and generate a reference output signal, and a storage unit configured to store a plurality of input signals of the plurality of input lines in response to the reference input signal and output the stored signals in response to the reference output signal.

In accordance with another exemplary embodiment of the present invention, a delay circuit includes a plurality of input lines; a delay unit configured to delay a reference input signal and generate a reference output signal, an input count unit configured to sequentially activate a plurality of input count signals in response to the reference input signal, an output count unit configured to sequentially activate a plurality of output count signals in response to the reference output signal, and a plurality of storage units each configured to store signals of the input lines in response to an input count signal corresponding thereto among the plurality of input count signals and output the stored signals in response to an output count signal corresponding thereto among the plurality of output count signals.

In accordance with yet another exemplary embodiment of the present invention, a signal delay method includes generating a reference output signal by delaying a reference input signal, sequentially activating N number of input count signals by counting N number of activations of the reference input signal, wherein N is a positive integer, separately storing N number of input signals in response to each of the input count signals, sequentially activating N number of output count signals by counting N number of activations of the reference output signals, and outputting N number of the stored input signals in response to each of the output count signals.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
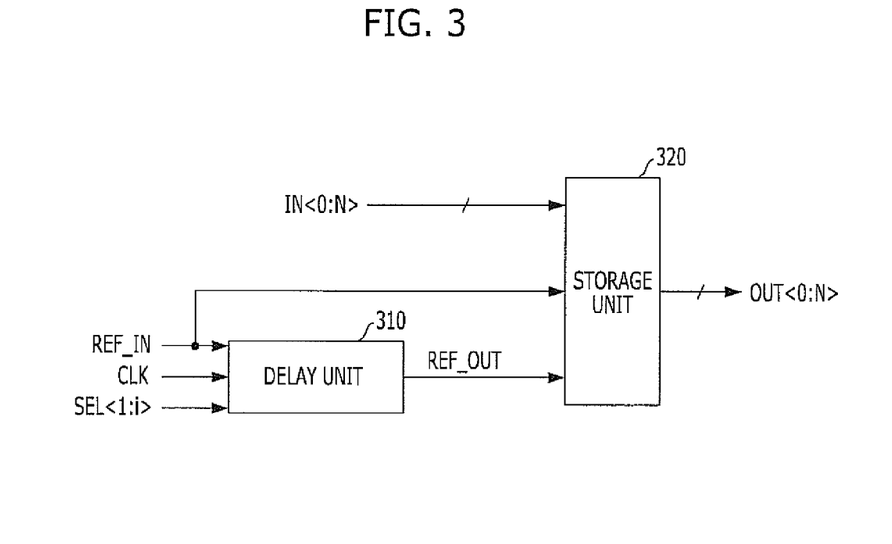
FIG. 3 is a block diagram of illustrating a configuration of a delay circuit in accordance with an exemplary embodiment of the present invention.

FIG. 3 is a block diagram of a delay circuit in accordance with an exemplary embodiment of the present invention.

Referring to FIG. 3, the delay circuit includes a delay unit 310 and a storage unit 320.

The delay unit 310 is configured to delay a reference input signal REF_IN and generate a reference output signal REF_OUT. A delay value of the delay unit 310 is determined in response to delay information SEL<1:i>. The delay information SEL<0:i> may include information on a delay value of the delay circuit for delaying signals inputted from a plurality of input lines IN<0:N>.

The reference input signal REF_IN may be a signal synchronized with signals inputted to the plurality of input lines IN<0:N>. In a memory device such as DRAM, row address signals are inputted in synchronization with a row address strobe (RAS) signal which is a command signal, and column address signals are inputted in synchronization with a column address strobe (CAS) signal which is a command signal. For example, when the signals of the input lines IN<0:N> are row address signals, the RAS signal becomes the reference input signal REF_IN. When the signals of the input lines IN<0:N> are column address signals, the CAS signal becomes the reference input signal REF_IN. When a signal synchronized with the signals transmitted to the plurality of input lines IN<0:N>, that is, a signal to be used as the reference input signal REF_IN is not provided, the reference input signal REF_IN may be generated through a circuit illustrated in FIG. 4.

The storage unit 320 is configured to store the signals of the input lines IN<0:N> in response to the reference input signal REF_IN and output the stored signals in response to the reference output signal REF_OUT. That is, when the reference input signal REF_IN is activated, the signals of the input lines IN<0:N> are inputted to and stored in the storage unit 320, and the stored signals are outputted to a plurality of output lines OUT<0:N> when the reference output signal REF_OUT is activated. Therefore, a difference in activation time point between the reference input signal REF_IN and the reference output signal REF_OUT becomes the delay value of the delay circuit.

In accordance with the exemplary embodiment of the present invention, the signals of the plurality of input lines IN<1:N> are delayed in the following manner: the signals on the input lines IN<0:N> are stored in the storage unit 320 and then outputted to the plurality of output lines OUT<0:N> when a predetermined time (corresponding to the delay value) passes from the time point at which the signals were stored. Therefore, although the number of input lines IN<0:N> increases, only the number of storage places for storing the signals of the input lines IN<0:N> increases. Accordingly, an increase of area due to the increase in the number of input lines IN<0: N> is relatively small. This is, it is substantially different from the conventional delay circuit in which the number of shifters may significantly increases as the number of input lines IN<0:N> increases.

For reference, although not illustrated in the drawing, a latch including an inverter pair may be provided in each of the output lines OUT<0:N>, in order to maintain a logic level of the signal of the output line.

Figure 4:
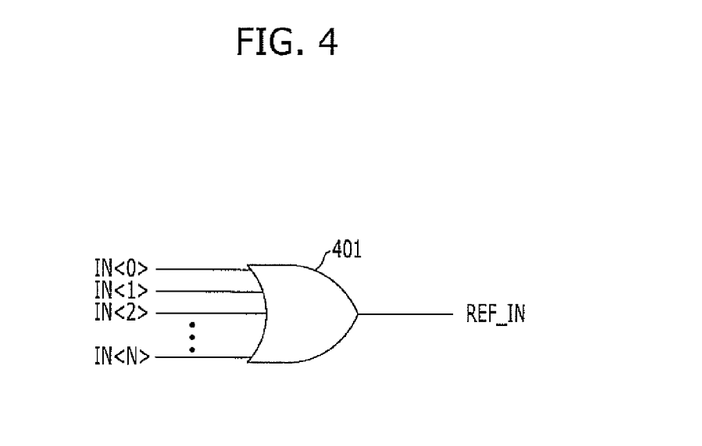
FIG. 4 illustrates a circuit for generating a reference input signal using the signals of a plurality of input lines.

FIG. 4 illustrates a circuit for generating the reference input signal REF_IN using the signals of the input lines IN<0:N>.

As described above, when a signal synchronized with the signals inputted to the input lines IN<0:N> exists, the signal may be used as the reference input signal REF_IN. On the other hand, when a signal synchronized with the signals inputted to the input lines IN<0:N> does not exist, the reference input signal REF_IN may be generated in such a manner as to be activated when one or more of the signals of the input line IN<0:N> are activated. Referring to FIG. 4, the circuit may include an OR gate 401 in which signals of the plurality of input lines IN<0:N> are set to an input thereof and the reference input signal REF_IN is set to an output thereof.

Figure 5:
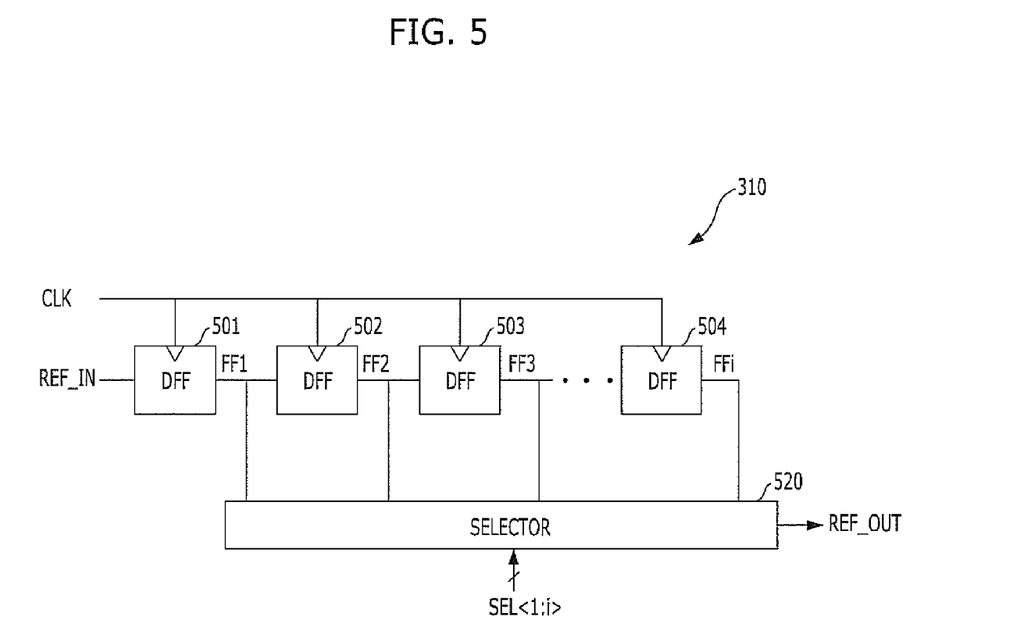
FIG. 5 is a block diagram of a delay unit shown FIG. 3.

FIG. 5 is a block diagram of illustrating a configuration of the delay unit 310 shown in FIG. 3.

Referring to FIG. 5, the delay unit 310 includes a plurality of shifters 501 to 504 coupled in series and a selector 520 configured to select one of outputs FF1 to FFi of the shifters 501 to 504.

Each of the shifters 501 to 504 coupled in series is configured to delay a signal inputted thereto by one clock in synchronization with a clock signal CLK. In particular, the shifter 501 delays the reference input signal REF_IN by one clock. The selector 520 is configured to select one of the output signals FF1 to FFi of the shifters 501 to 504 in response to delay information SEL<1:i> and output the selected signal as a reference output signal REF_OUT. For example, when a signal SEL<2> of signals composing the delay information SEL<1:i> is activated, the selector 520 selects the signal FF2 to output as the reference output signal REF_OUT, and when a signal SEL<i> is activated, the selector 520 selects the signal FFi to output as the reference output signal REF_OUT.

In short, the delay unit 310 delays the reference input signal REF_IN by a delay value (clock number) determined by the delay information SEL<1:i> and generates the reference output signal REF_OUT.

Figure 6:
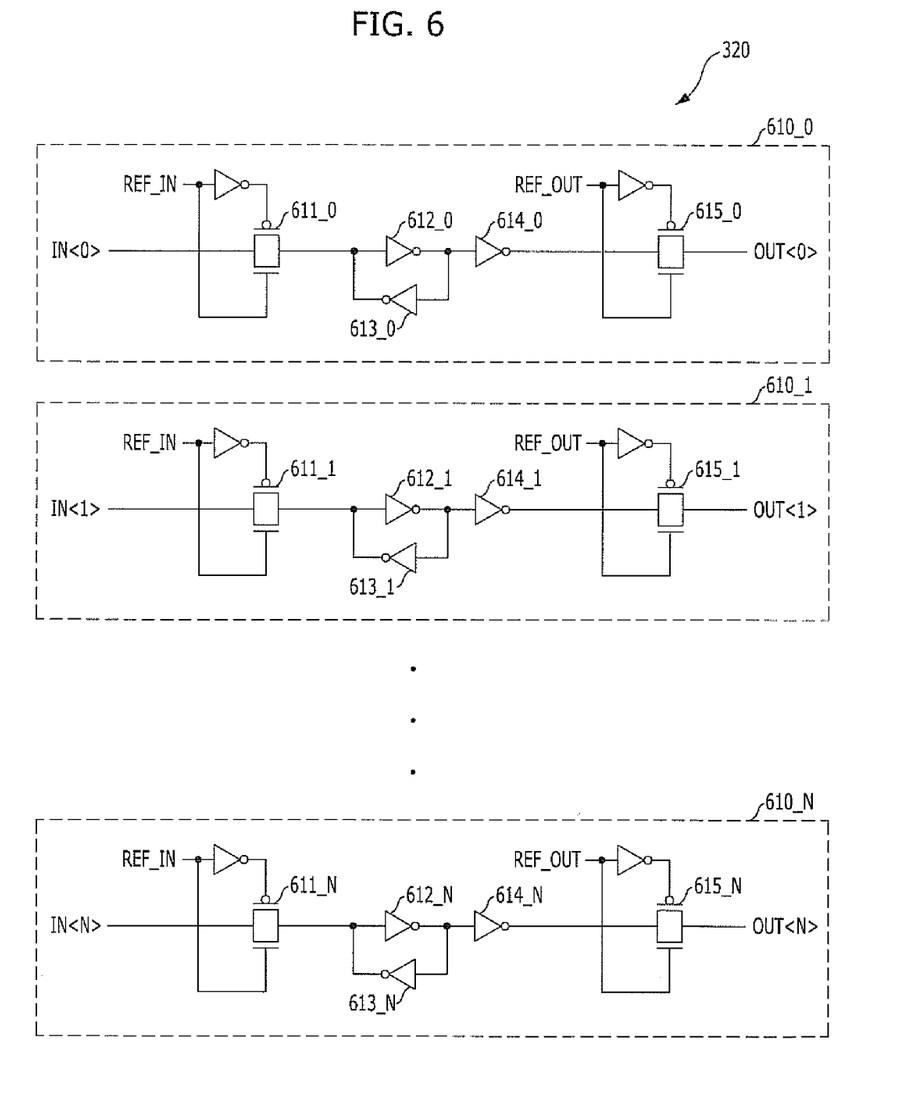
FIG. 6 is a circuit diagram of a storage unit illustrated in FIG. 3.

FIG. 6 is a circuit diagram of the storage unit 320 shown in FIG. 3.

Referring to FIG. 6, the storage unit 320 includes the same number of latches 610_0~N as the plurality of input lines IN<0:N>.

The latches 610_0~N include pass gates 611_0~N, inverters 612_0~N, 613_0~N, and 614_0~N, and pass gates 615_0~N, respectively. The pass gates 611_0~N are turned on/off in response to the reference input signal REF_IN, the inverters 612_0~N, 613_0~N, and 614_0~N are configured to store signals, and the pass gates 615_0~N are turned on/off in response to the reference output signal REF_OUT.

The storage unit 320 is operated as follows. When the reference input signal REF_IN is activated to a high level, the pass gates 611_0~N are turned on, and the signals of the input lines IN<0:N> are inputted through the turned-on pass gates 611_0~N and then stored in the inverters 612_0~N, 613_0~N, and 614_0~N. Furthermore, when the reference output signal REF_OUT is activated to a high level, the pass gates 615_0~N are turned on, and the stored signals are outputted to the output lines OUT<0:N> through the pass gates 615_0~N.

Figure 7:
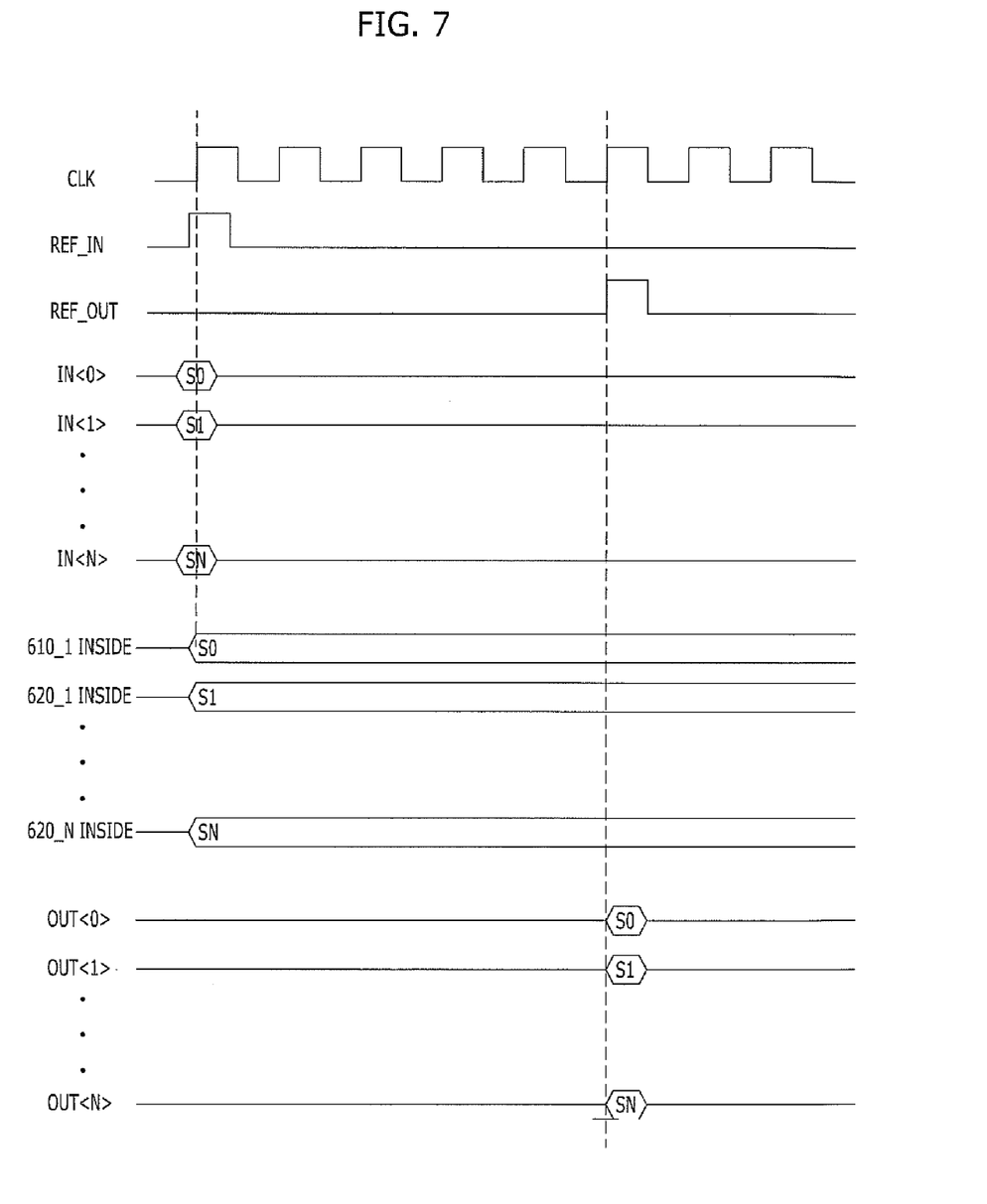
FIG. 7 is a timing diagram showing the entire operation of the delay circuit of FIG. 3.

FIG. 7 is a timing diagram showing the entire operation of the delay circuit of FIG. 3.

For the illustrative purpose, assuming that the signal SEL<5> of the signals composing the delay information SEL<0:i> is activated, the delay value of the delay circuit may be set to five clocks.

First, as the reference input signal REF_IN is activated, signals S0 to SN are inputted to the respective input lines IN<0:N>. Then, the signals S0 to SN are stored in the latches 610_0 to 610_N of the storage unit 320 in response to the input reference signal REF_IN. When the time of five clocks passes after the activation time point of the reference input signal REF_IN, the reference output signal REF_OUT is activated, and the signals S0 to SN stored in the latches 610_0 to 610_N are outputted to the respective output lines OUT<0:N> in response to the reference output signal REF_OUT.

Figure 8:
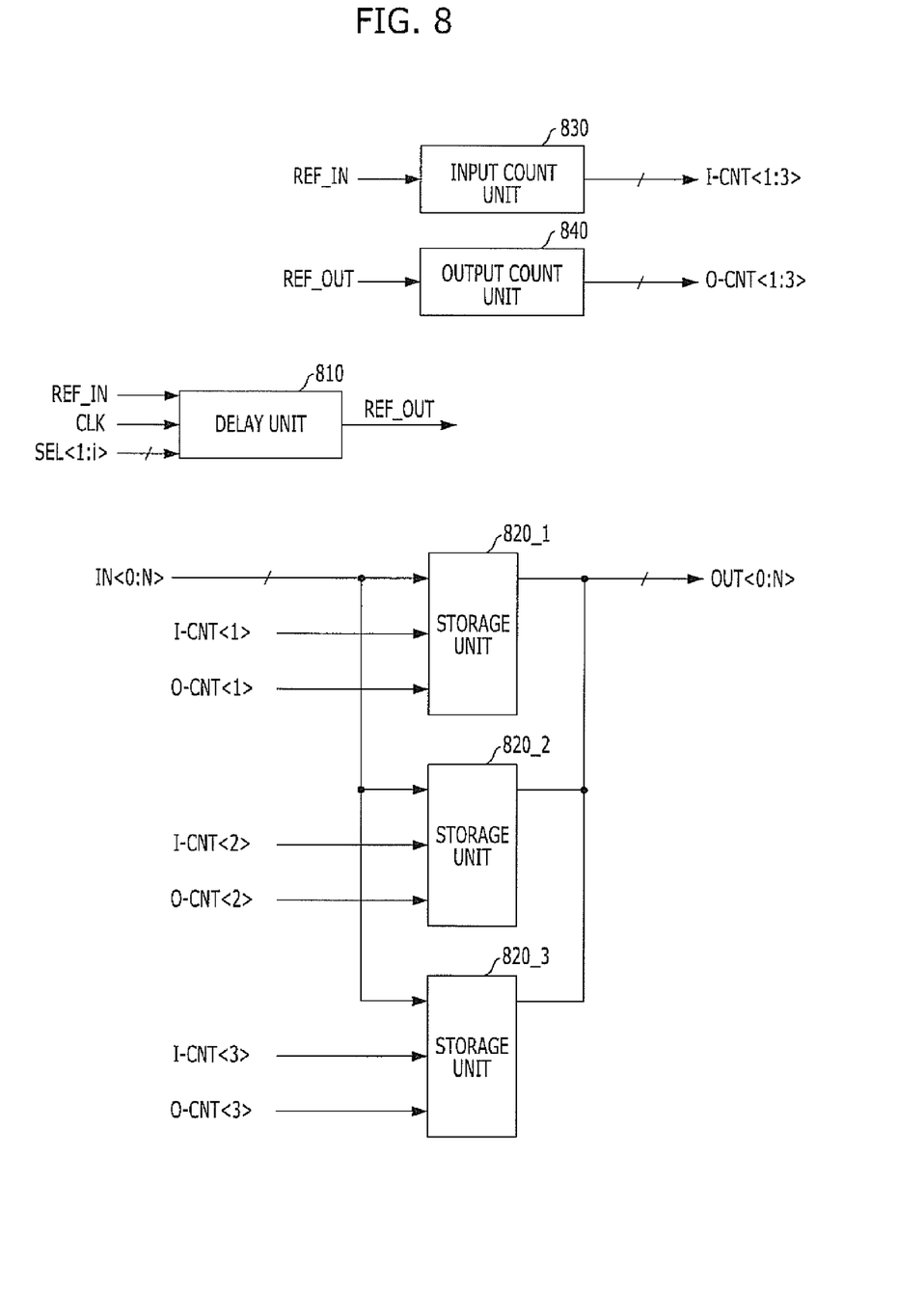
FIG. 8 is a block diagram of a delay circuit in accordance with another exemplary embodiment of the present invention.

FIG. 8 is a block diagram of showing a configuration of a delay circuit in accordance with another exemplary embodiment of the present invention.

Referring to FIG. 8, the delay circuit includes a delay unit 810, an input count unit 830, an output count unit 840, and a plurality of storage units 820_1 to 820_3. The delay circuit shown in FIG. 8 is different from the delay circuit shown in FIG. 3 in that the delay circuit shown on FIG. 8 includes the input count unit 830, the output counter unit 840, and the plurality of storage units 820_1 to 820_3.

The delay unit 810 is configured to delay a reference input signal REF_IN and generate a reference output signal REF_OUT. The delay unit 810 may be configured in the same manner as the delay unit 310 shown in FIG. 3.

The input count unit 830 is configured to sequentially activate a plurality of input count signals I-CNT<1:3> in response to the reference input signal REF_IN. When the reference input signal REF_IN is activated as a first active reference input signal, the input count signal I-CNT<1> is activated; when the reference input signal REF_IN is activated as a second active reference input signal, the input count signal I-CNT<2> is activated; and when the reference input signal REF_IN is activated as a third active reference input signal, the input count signal I-CNT<3> is activated. Furthermore, when the reference input signal REF_IN is activated as a fourth active reference input signal, the input count signal I-CNT<1> is activated.

The output count unit 840 is configured to sequentially activate a plurality of output count signals O-CNT<1:3> in response to a reference output signal REF_OUT. When the reference output signal REF_OUT is activated as a first active reference output signal, the output count signal O-CNT<1> is activated; when the reference output signal REF_OUT is activated as a second active reference output signal, the output count signal O-CNT<2> is activated; and when the reference output signal REF_OUT is activated as a third active reference output signal, the output count signal O-CNT<3> is activated. Furthermore, when the reference output signal REF_OUT is activated as fourth active reference output signal, the output count signal O-CNT<1> is activated.

Each of the storage units 820_1 to 820_3 is configured to store signals of a plurality of input lines IN<0:N> in response to a signal corresponding thereto among the plurality of the input count signals I-CNT<1:3> and output the stored signals to a plurality of output lines OUT<0:N> in response to a signal corresponding thereto among the plurality of output count signals O-CNT<1:3>. The storage unit 820_1 operates in response to the input count signal I-CNT<1> and the output count signal O-CNT<1>, and the storage unit 820-2 operates in response to the input count signal I-CNT<2> and the output count signal O-CNT<2>. Furthermore, the storage unit 820-3 operates in response to the input count signal I-CNT<3> and the output count signal O-CNT<3>. The storage units 820_1 to 820_3 may be configured in the same manner as the storage unit 320 described with reference to FIGS. 3 to 6. However, the storage units 820_1 to 820_3 are different from the storage unit 320 in that the storage units 820_1 to 820_3 operate in response to the input count signal I-CNT<1:3> and the output signals O-CNT<1:3> corresponding to the respective storage units 820_1 to 820_3, instead of the reference input signal REF_IN and the reference output signal REF_OUT.

According to the delay circuit of FIG. 8, the plurality of storage units 820_1 to 820_3 are provided. Therefore, although signals are frequently inputted to the plurality of input lines IN<0:N>, the delay circuit may operate stably. The delay circuit shown in FIG. 3 may malfunction when new signals are inputted to the input lines IN<0:N> before the signals stored in the delay circuit are outputted to the plurality of output lines OUT<0:N>. According to the delay circuit shown in FIG. 8, however, the signals which are inputted as the first through the input lines IN<0:N> are delayed by the storage unit 820_1, and the signals which are inputted as the second are delayed by the storage unit 820_2. In FIG. 8, the number of storage units 820_1 to 820_3 is set to 3. However, two or three or more storage units may be provided. As the number of storage units increases, a more stable delay operation may be performed.

Figure 9:
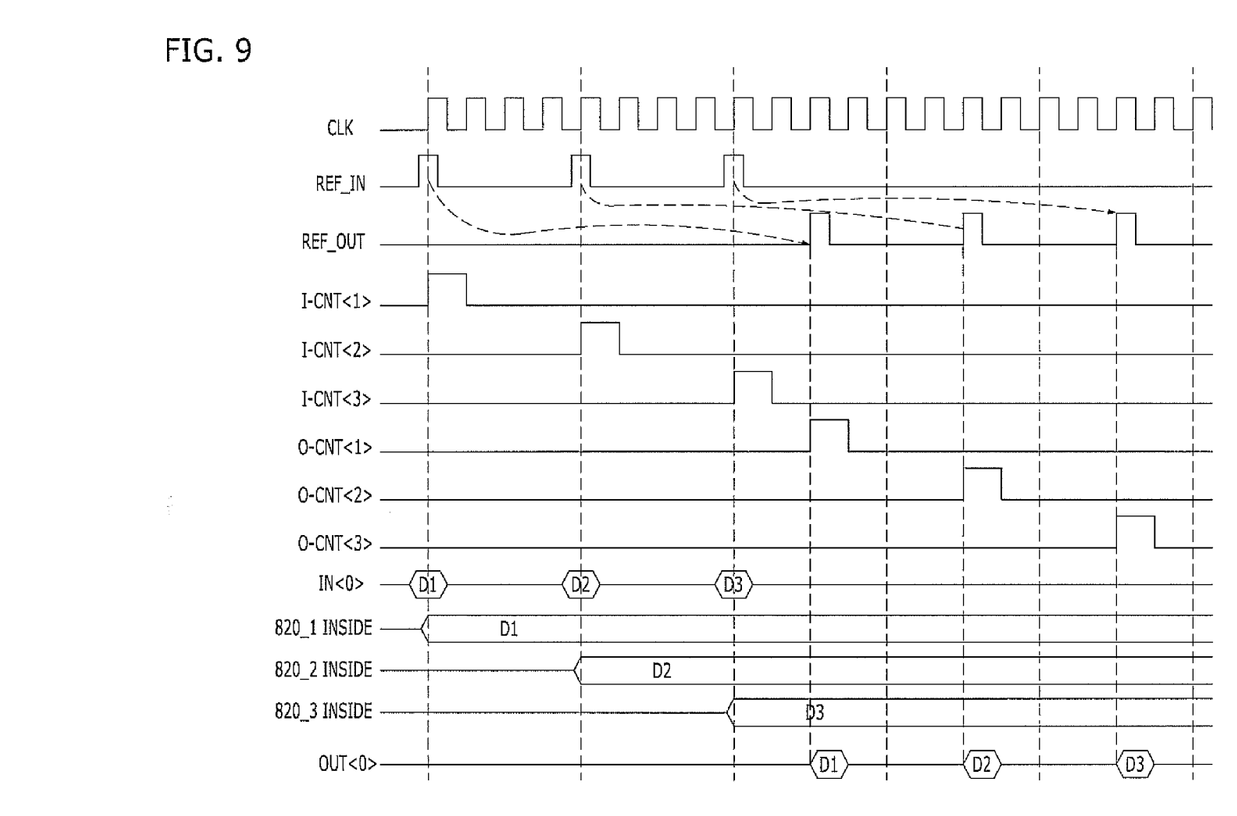
FIG. 9 is a timing diagram showing the operation of the delay circuit shown in FIG. 8.

FIG. 9 is a timing diagram showing the operation of the delay circuit shown in FIG. 8.

For the illustrative purpose, FIG. 9 illustrates only a process in which a signal inputted to the input line IN<0> among the plurality of input lines IN<0:N> is delayed. Furthermore, it is described as an example that a signal SEL<10> of the signals composing the delay information SEL<0:i> is activated, that is, the delay value of the delay circuit is set to 10 clocks. The signals of the input lines IN<1:N> which are not shown in FIG. 9 are delayed in the same manner as the signal of the input line IN<0>.

First, the reference input signal REF_IN is activated as the first active reference input signal, and a first signal D1 is inputted to the input line IN<0> in synchronization with the first active reference input signal REF_IN. The input count signal I-CNT<1> is activated in response to the first active reference input signal REF_IN, and the storage unit 820-1 stores the signal D1 in response to the activated input count signal I-CNT<1>.

The reference input signal REF_IN is activated as the second active reference input signal, and a second signal D2 is inputted to the input line IN<0> in synchronization with the second active reference input signal REF_IN. The input count signal I-CNT<2> is activated in response to the second active reference input signal REF_IN, and the storage unit 820_2 stores the signal D2 in response to the activated input count signal I-CNT<2>.

The reference input signal REF_IN is activated as the third active reference signal, and a third signal D3 is inputted to the input line IN<0> in synchronization with the third active reference input signal REF_IN. The input count signal I-CNT<3> is activated in response to the third active reference input signal REF_IN, and the storage unit 820_3 stores the signal D3 in response to the activated input count signal I-CNT<3>.

The reference output signal REF_OUT is activated as the first when ten clocks passes after the first active reference input signal REF_IN was activated. The output count signal O-CNT<1> is activated in response to the first activation of the reference output signal REF_OUT, and the signal D1 stored in the storage unit 820_1 is outputted to the output line OUT<0> in response to the activated output count signal O-CNT<1>.

The reference output signal REF_OUT is activated as second when ten clocks pass after the second active reference input signal REF_IN was activated. The output count signal O-CNT<2> is activated in response to the second activation of the reference output signal REF_OUT, and the signal D2 stored in the storage unit 820_2 is outputted to the output line OUT<0> in response to the activated output count signal O-CNT<2>.

The reference output signal REF_OUT is activated when ten clocks passes after the third reference input signal REF_IN was activated. The output count signal O-CNT<3> is activated in response to the third activation of the reference output signal REF_OUT, and the signal D3 stored in the storage unit 820_3 is outputted to the output line OUT<0> in response to the activated output count signal O-CNT<3>.

Referring to FIG. 9, the signals D1 to D3 inputted through the input line IN<0> are stored in the different storage units 820_1 to 820_3, respectively, and then outputted. That is, while the input line IN<0> and the output line OUT<0> are commonly used, the signals D1 to D3 are delayed through the separate paths, respectively. Therefore, the operation of the delay circuit of FIG. 8 may be performed stably.

In accordance with the embodiments of the present invention, the area of the delay circuit for delaying a plurality of signals may be reduced in an effective manner. Furthermore, although the plurality of signals may be successively activated within a short period, a stable operation of the delay circuit may be secured.

While the present invention has been described with respect to the specific embodiments, it will be apparent to those skilled in the art that various changes and modifications may be made without departing from the spirit and scope of the invention as defined in the following claims.

What is claimed is:

1. A delay circuit comprising:
   a plurality of input lines;
   a delay unit configured to delay a reference input signal and generate a reference output signal; and
   a storage unit configured to store a plurality of input signals of the plurality of input lines in response to the reference input signal and output the stored signals in response to the reference output signal.

2. The delay circuit of claim 1, wherein the delay unit is configured to delay the reference input signal by a delay value which is changed in response to a latency value of the plurality of input signals.

3. The delay circuit of claim 1, wherein the reference input signal comprises a signal synchronized with the plurality of input signals.

4. The delay circuit of claim 1, wherein the reference input signal comprises a signal activated when one or more of the plurality of input signals are activated.

5. The delay circuit of claim 2, wherein the delay unit includes:
   a plurality of shifters coupled in series and configured to delay the reference signal, each shifter configured to shift an input signal in response to a clock signal to generate a shifted signal; and
   a selector configured to select and output one of the shifted signal from the shifter as the reference output signal in response to a selection signal representing the delay value.

6. The delay circuit of claim 1, wherein the storage unit comprises a plurality of latches, each latch configured to temporarily store a corresponding input signal in response to the reference input signal and output the stored corresponding input signal in response to the reference output signal.

7. A delay circuit comprising:
   a plurality of input lines;
   a delay unit configured to delay a reference input signal and generate a reference output signal;
   an input count unit configured to sequentially activate a plurality of input count signals in response to the reference input signal;
   an output count unit configured to sequentially activate a plurality of output count signals in response to the reference output signal; and
   a plurality of storage units, each configured to store signals of the input lines in response to an input count signal corresponding thereto among the plurality of input count signals and output the stored signals in response to an output count signal corresponding thereto among the plurality of output count signals.

8. The delay circuit of claim 7, wherein one storage unit of the plurality of storage units corresponds to one input count signal of the plurality of input count signals and one output count signal of the plurality of output count signals.

9. The delay circuit of claim 7, wherein the delay unit is configured to delay the reference input signals by a delay value changed in response to a delay value of the signals of the input lines.

10. The delay circuit of claim 7, wherein the reference input signal comprises a signal synchronized with the signals of the input lines.

11. The delay circuit of claim 7, wherein the reference input signal is activated when one or more of the signals of the input lines are activated.

12. The delay circuit of claim 7, wherein a storage unit comprises a number of latches corresponding to a number of the input lines, and each of the latches is configured to receive and store corresponding one of the signals of the input lines in response to an input count signal corresponding thereto and output the stored signal in response to an corresponding output count signal.

13. The delay circuit of claim 7, wherein the delay circuit is included in a memory device,
   the reference input signal is a command, and
   the signals of the input lines are address signals.

14. A signal delay method comprising:
   generating a reference output signal by delaying a reference input signal;
   sequentially activating N number of input count signals by counting N number of activations of the reference input signal, wherein N is a positive integer;
   separately storing N number of input signals in response to each of the input count signals;
   sequentially activating N number of output count signals by counting N number of activations of the reference output signals; and
   outputting N number of the stored input signals in response to each of the output count signals.

15. The signal delay method of claim 14, wherein the reference input signal comprises a signal synchronized with the plurality of input signals.

16. The signal delay method of claim 14, wherein the reference input signal is activated when one or more of the plurality of input singles are activated.

* * * * *